United States Patent
Choi et al.

(10) Patent No.: US 10,340,929 B2
(45) Date of Patent: Jul. 2, 2019

(54) VOLTAGE CONTROLLED OSCILLATOR AND PHASE LOCKED LOOP COMPRISING THE SAME

(71) Applicant: Industry-Academic Cooperation Foundation, Yonsei University, Seoul (KR)

(72) Inventors: Woo-Young Choi, Seoul (KR); Sung-Geun Kim, Gyeonggi-do (KR)

(73) Assignee: YONSEI UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 196 days.

(21) Appl. No.: 15/376,346

(22) Filed: Dec. 12, 2016

(65) Prior Publication Data
US 2017/0170836 A1    Jun. 15, 2017

(30) Foreign Application Priority Data

Dec. 10, 2015  (KR) .......................... 10-2015-0175942

(51) Int. Cl.
*H03K 3/03*    (2006.01)
*H03L 7/08*    (2006.01)
(Continued)

(52) U.S. Cl.
CPC ............. *H03L 7/0995* (2013.01); *H03K 3/03* (2013.01); *H03K 3/0315* (2013.01);
(Continued)

(58) Field of Classification Search
CPC ......... H03L 7/099; H03L 1/00; H03L 7/0997; H03L 2207/06; H03L 2207/50;
(Continued)

(56) References Cited

U.S. PATENT DOCUMENTS 7,907,018 B2 *  3/2011  Pellerano ................ H03L 7/099
                                                 331/1 A
8,149,023 B2    4/2012  Rajagopalan et al.

FOREIGN PATENT DOCUMENTS

KR    10-2006-0092559 A    8/2006
KR    10-2007-0098612 A    10/2007
KR    10-2014-0117938 A    10/2014

OTHER PUBLICATIONS

Choi, H-H., et al., Design of Phase Locked Loop With Supply Noise Detector for Improving Noise Reduction, Journal of the Korea Institute of Information and Communication Engineering, 18(9), Sep. 2014, pp. 2176-2182.

* cited by examiner

*Primary Examiner* — Arnold M Kinkead
(74) *Attorney, Agent, or Firm* — Procopio, Cory, Hargreaves & Savitch LLP

(57) ABSTRACT

The present invention relates to a voltage controlled oscillator and phase locked loop comprising the same for compensating a noise of a power voltage. According to an embodiment of the present invention, a voltage controlled oscillator may comprise: an oscillator comprising a plurality of inverters connected as a ring form for generating a plurality of signals having different phases with each other, and a plurality of feed forward circuits formed between the inverters; and a controller for controlling the inverter and feed forward circuit based on a detected noise by detecting a noise of a power voltage.

15 Claims, 7 Drawing Sheets

(51) Int. Cl.
  *H03L 7/10* (2006.01)
  *H03L 7/093* (2006.01)
  *H03L 7/099* (2006.01)
(52) U.S. Cl.
  CPC ............ *H03L 7/0802* (2013.01); *H03L 7/093* (2013.01); *H03L 7/101* (2013.01); *H03L 7/102* (2013.01)
(58) Field of Classification Search
  CPC ..... H03L 5/00; H03L 7/00; H03L 7/06; H03L 7/08; H03L 7/0805; H03L 7/0995; H03L 7/0802; H03L 7/093; H03L 7/101; H03L 7/102; H03K 3/0315; H02M 3/07
  USPC .................................... 331/175, 57; 327/156
  See application file for complete search history.

VOLTAGE CONTROLLED OSCILLATOR AND PHASE LOCKED LOOP COMPRISING THE SAME

CROSS-REFERENCE TO RELATED APPLICATIONS

This U.S. non-provisional patent application claims priority under 35 U.S.C. § 119 of Korean Patent Application No. 10-2015-0175942, filed on Dec. 10, 2015, the entire contents of which are hereby incorporated by reference.

BACKGROUND OF THE INVENTION

The present invention disclosed herein relates to a voltage controlled oscillator and phase locked loop comprising the same.

Recently, in designing IC (Integrated Circuit) decreasing power consumption and increasing energy efficiency has become an important issue. To solve this problem, lowering power voltage method has been used and therefore designing to drive PLL (Phase-Locked Loop) in a low power voltage is in center of attention.

The PLL is a required circuit in the wire and wireless communication. It is used to get the same frequency with the reference signal by sub-circuit or to get a stable obtained frequency. The PLL function differs depending on a power noise and especially the VCO (Voltage Controlled Oscillator) is sensitive to the power noise that its oscillation frequency differs depending on the power noise.

Generally, a power voltage regulator is used to compensate a power noise. However, this requires an additional transistor stacking in the circuit and thereby is not appropriate at the low power voltage since it causes a problem in a power head room.

SUMMARY OF THE INVENTION

The present invention provides a voltage controlled oscillator and phase locked loop comprising the same efficiently operating at a low power voltage.

Also, the present invention provides a phase locked loop which is not sensitive to power noise and decrease power consumption by using a voltage controlled oscillator comprising a circuit for compensating the power noise.

The objects of the inventive concept are not limited to the above mentioned objects. Other objects thereof will be understandable by those skilled in the art from the following descriptions.

According to an embodiment of the present invention, a voltage controlled oscillator may comprise: a oscillator comprising a plurality of inverters connected as a ring form for generating a plurality of signals having different phases with each other, and a plurality of feed forward circuits formed between the inverters; and a controller for controlling the inverter and feed forward circuit based on a detected noise by detecting a noise of a power voltage.

The controller may comprise a detector for detecting a variation of the power voltage and average of the variation.

The detector may comprise a first NMOS transistor and a first PMOS transistor connected between a ground node and a power source supplied with the power voltage, wherein the variation may be detected by voltage division from impedance of the first PMOS transistor and the first NMOS transistor.

The detector may comprise a second NMOS transistor and a second PMOS transistor connected between a ground node and a power source supplied with the power voltage, and a capacitor connected to the second NMOS transistor in a row, wherein the average may be determined by voltage of a node connected with the second PMOS transistor, the second NMOS transistor, and the capacitor.

The controller may comprise: a voltage generator for generating a voltage for controlling the feed forward circuit and the inverter based on a difference between the variation and the average.

The voltage generator may comprise: a first inverting amplifier for outputting a direct control voltage controlling the inverter, receiving the variation in an inverting electrode, and receiving the average in a non-inverting electrode; and a second inverting amplifier for outputting a feed forward control voltage controlling the feed forward circuit, receiving the average in an inverting electrode and receiving the variation in a non-inverting electrode.

The inverter may comprise a CMOS inverter where a body bias of a PMOS transistor is controlled by the direct control voltage, wherein the feed forward circuit may comprise a CMOS inverter where a body bias of a PMOS transistor is controlled by the feed forward control voltage.

According to an embodiment of the present invention, a phase locked loop may comprise: a phase frequency detector for outputting a pull-up signal or a pull-down signal by detecting voltage and frequency of a feedback signal which corresponds to an input signal and an output signal; a charge pump for outputting a control voltage corresponding to the pull-up signal or the pull-down signal; a loop filter for removing high frequency component of the control voltage; and a voltage controlled oscillator for generating the output signal having a variable frequency depending on a control signal of the loop filter.

The voltage controlled oscillator may comprise: a oscillator comprising a plurality of inverters connected as a ring form for generating a plurality of signals having different phases with each other, and a plurality of feed forward circuits formed between the inverters; and a controller for controlling the inverter and feed forward circuit based on a detected noise by detecting a noise of a power voltage.

The controller may comprise a detector for detecting a variation of the power voltage and average of the variation.

The detector may comprise: a first NMOS transistor and a first PMOS transistor connected between a ground node and a power source supplied with the power voltage, wherein the variation may be detected by voltage division from impedance of the first PMOS transistor and the first NMOS transistor.

The detector may comprise: a second NMOS transistor and a second PMOS transistor connected between a ground node and a power source supplied with the power voltage; and a capacitor connected to the second NMOS transistor in a row, wherein the average may be determined by voltage of a node connected with the second PMOS transistor, the second NMOS transistor, and the capacitor.

The controller may comprise: a voltage generator for generating a voltage for controlling the feed forward circuit and the inverter based on a difference between the variation and the average.

The voltage generator may comprise: a first inverting amplifier for outputting a direct control voltage controlling the inverter, getting the variation in an inverting electrode, and getting the average in a non-inverting electrode; and a second inverting amplifier for outputting a feed forward control voltage controlling the feed forward circuit, getting the average in an inverting electrode and getting the variation in a non-inverting electrode.

The inverter may be a CMOS inverter where a supply current is controlled by a PMOS transistor which is controlled by a control signal of the loop filter and connected to a top of the inverter.

The inverter may comprise a CMOS inverter which a body bias of a PMOS transistor is controlled by the direct control voltage, wherein the feed forward circuit may comprise a CMOS inverter which a body bias of a PMOS transistor is controlled by the feed forward control voltage.

A phase locked loop comprising a voltage controlled oscillator in accordance with an embodiment of the present invention may be generated efficiently at a low voltage.

Also, a phase locked loop in accordance with an embodiment of the present invention may have an effect in decreasing power consumption and insensible to a power noise by using a voltage controlled oscillator having a power noise compensation circuit.

The objects of the inventive concept are not limited to the above mentioned effects. Other objects thereof will be understandable by those skilled in the art from the following descriptions.

DETAILED DESCRIPTION

Figure 1:
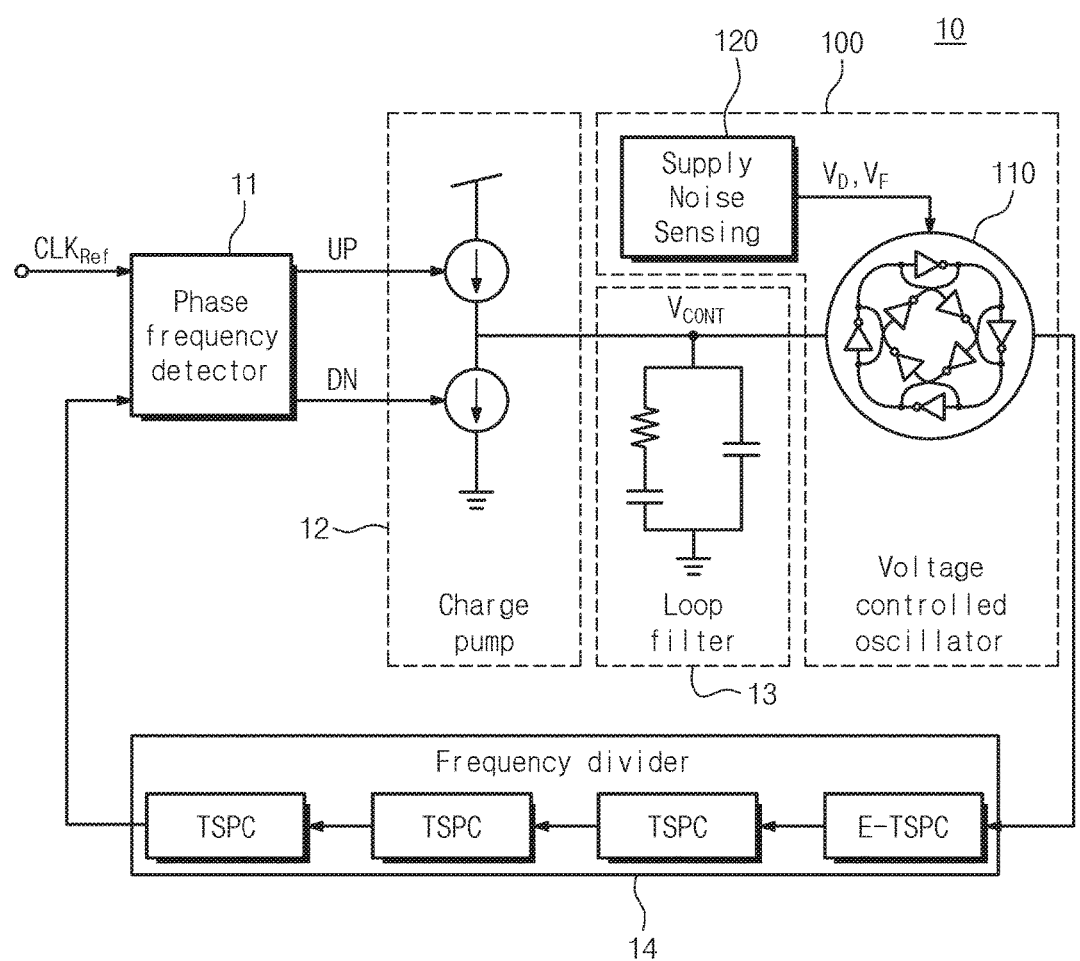
FIG. 1 shows a phase locked loop in accordance with an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Unless otherwise defined, all terms (including technical and scientific terms) used herein have the same meaning as generally understood by those skilled in the art. Moreover, detailed descriptions related to well-known functions or configurations will be ruled out in order not to unnecessarily obscure subject matters of the inventive concept. It is also noted that like reference numerals denote like elements in appreciating the drawings.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," "including," "have," "having," etc., when used in this specification, specify the presence of stated features, integers, steps, operations, elements, and/or components, but do not preclude the presence or addition of one or more other features, integers, steps, operations, elements, components, and/or groups thereof. As used herein, the term "connect" includes direct connection between one component and another component and indirection connection by the other component.

A phase locked loop according to an embodiment of the present invention may increase efficiency in operating at a low power voltage by comprising a voltage controlled oscillator for compensating power noise. Specifically, the present invention provides a voltage controlled oscillator which may compensate power noise without needing additional transistor stacking.

FIG. 1 shows a phase locked loop 10 in accordance with an embodiment of the present invention.

Referring to FIG. 1, the phase locked loop 10 comprises a phase frequency detector 11, a charge pump 12, a loop filter 13, a frequency divider 14, and a voltage controlled oscillator 100. The phase locked loop 10 generates an output signal synthesized in a reference signal ($CLK_{Ref}$).

The phase frequency detector 11 detects phase and frequency of feedback signal corresponding to output signal of the voltage controlled oscillator 100 and $CLK_{Ref}$ which is input signal. The phase frequency detector 11 outputs a pull-up signal (UP) or a pull-down signal (DN) depending on a result comparing the $CLK_{Ref}$ and the feedback signal. The $CLK_{Ref}$ may be a signal having reference frequency. The feedback signal may be a signal that frequency has been distributed (demultipled) by the frequency divider 14 from the output signal of the voltage controlled oscillator 100.

For example, if a phase of the $CLK_{Ref}$ is slower than the feedback signal the phase frequency detector 11 may output pull-up signal (UP), and if a phase of the $CLK_{Ref}$ is faster than the feedback signal it may output pull-down signal (DN). The UP and DN which have been output from the phase frequency detector 11 are input to the charge pump 12.

The charge pump 12 receive UP or DN outputted from the phase frequency detector 11 and outputs a control signal ($V_{CONT}$) by corresponding to the UP or DN. For example, the charge pump 12 outputs $V_{CONT}$ which has relatively high voltage when it receives UP from the phase frequency detector 11 and outputs $V_{CONT}$ which has relatively low voltage when receives DN from the phase frequency detector 11.

The loop filter 13 removes high frequency component from the $V_{CONT}$ outputted from the charge pump 12. In an embodiment, the loop filter 13 may comprise at least one of a capacitor and resistor. The loop filter 13 may be used as an active loop filter having operational amplifier and a passive loop filter composed of only passive elements. The loop filter 13 is not limited to the structure of FIG. 1 and may be provided with various structures. The $V_{CONT}$ that a high frequency component has been removed by the loop filter 13 is input to the voltage controlled oscillator 100. A structure of the voltage controlled oscillator 100 is explained in detail by referring to FIGS. 2 to 4.

The frequency divider 14 generates a feedback signal by dividing a frequency of an output signal of the voltage controlled oscillator 100. A feedback signal outputted from the frequency divider 14 is input to the phase frequency detector 11 as a feedback. As shown in FIG. 1, according to an embodiment the frequency divider 14 may be a 1/16 frequency divider composed of E-FSPC (extended true-single-phase-clock) D flip flop and three TSPC (true-singlephase-clock) D flip flops. The 1/16 frequency divider as shown in FIG. 1 may be used for fast operation velocity and low power consumption. However, a form of the frequency divider 14 which could be used in the phase locked loop 10 in accordance with an embodiment of the present invention is not limited in herein.

Hereinafter explains a structure and operation of the voltage controlled oscillator 100 in accordance with an embodiment of the present invention in detail by referring to FIGS. 2 to 4. As shown in FIG. 1, the controlled oscillator 100 in accordance with an embodiment of the present invention comprises a oscillator 110 and a controller 120.

Figure 2:
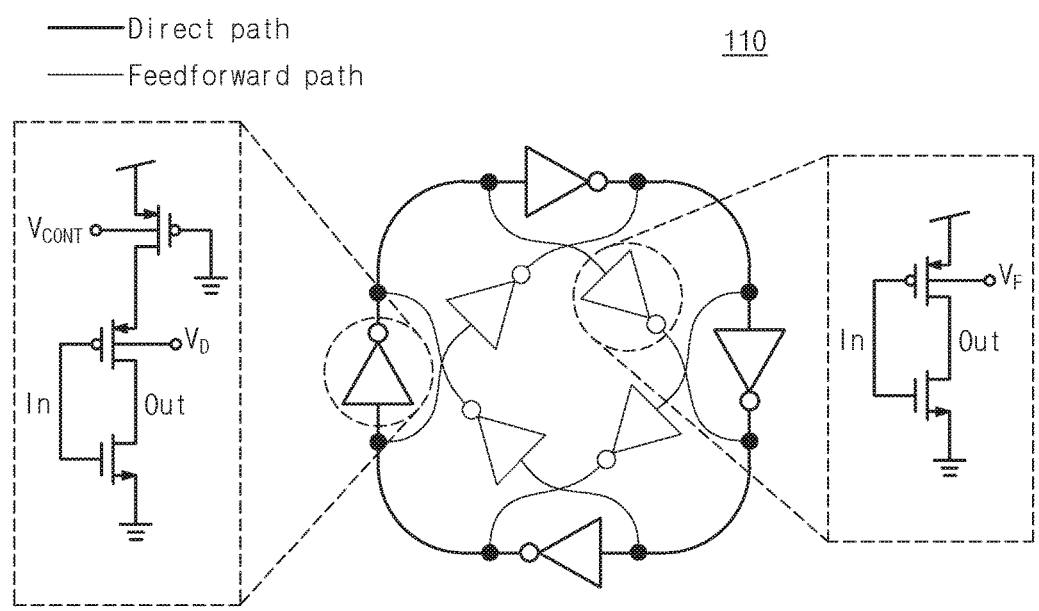
FIG. 2 shows a voltage controlled oscillator in accordance with an embodiment of the present invention.
Figure 3:
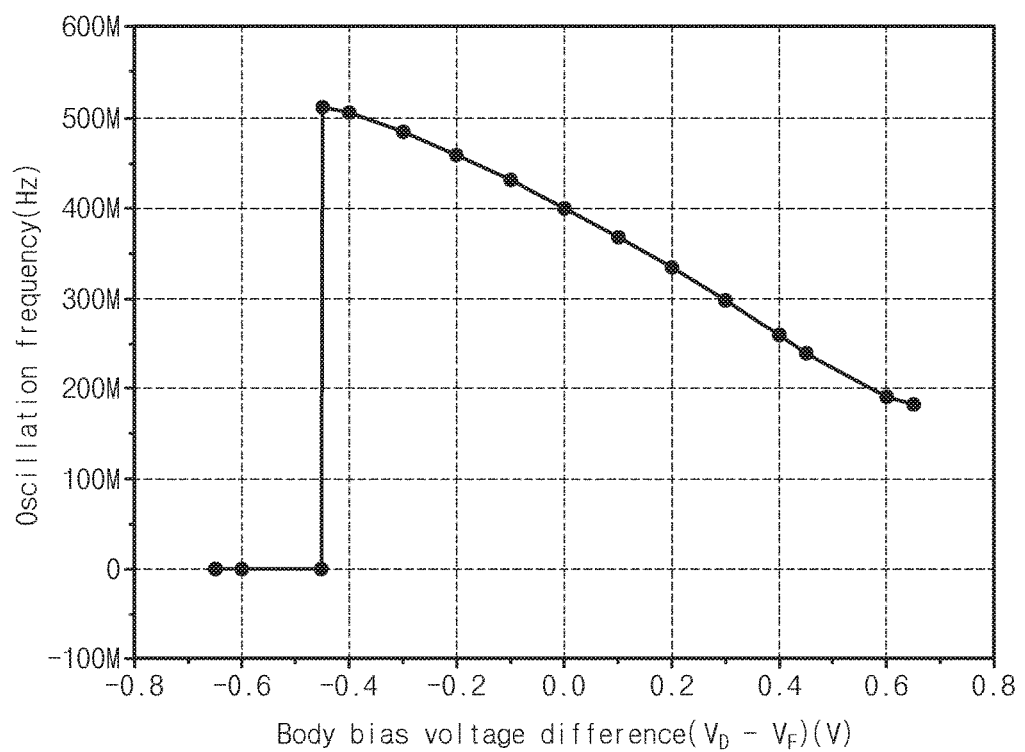
FIG. 3 is a graph showing oscillation frequency according to a body bias voltage control of the oscillator of FIG. 2.

FIG. 2 shows the oscillator 110 of the voltage controlled oscillator 100 in accordance with an embodiment of the present invention.

The oscillator 110 may be connected with a plurality of inverters as a ring form for each generating a plurality of signals having different phases with each other and it may be a feed forward ring oscillator comprising a plurality of feed forward circuits formed between the inverters. As shown in FIG. 2, the feed forward ring oscillator comprises a direct path and a feed forward path. According to an embodiment, the oscillator 110 may be a 4-stage feed forward ring oscillator outputting a signal where each inverter having a signal with difference of 90° phase. However, a form of the oscillator 110 is not limited herein but may be another form of feed forward ring oscillator by adjusting the number of inverter.

Referring to FIG. 2, the inverters included in the direct may be a current-starved CMOS inverter controlled by the PMOS transistor. Also as shown in FIG. 2, the inverter included in the feed forward path may be CMOS inverter.

In the inverter included in the direct path, the PMOS transistor supplied with a power voltage, that is a body of the PMOS transistor controlling a current supplied to the inverter may control frequency of the oscillator 110 by connected to the loop filter 13. Controlling body bias of the PMOS transistor is possible at a low power voltage without latch-up.

In the feed forward ring oscillator, ratio of a driving strength of the feed forward path and the direct path may be a factor determining oscillation frequency. FIG. 3 is a graph showing oscillation frequency according to a body bias voltage control of the oscillator of FIG. 2. As shown in FIG. 3, oscillation frequency of the feed forward ring oscillator may be controlled depending on a difference ($V_D$-$V_F$) of a PMOS body bias of the CMOS inverter included in the direct path and the feed forward path. Therefore, the body bias of the feed forward ring oscillator may be controlled based on a detected power voltage noise and compensate a noise of the power voltage.

Figure 4:
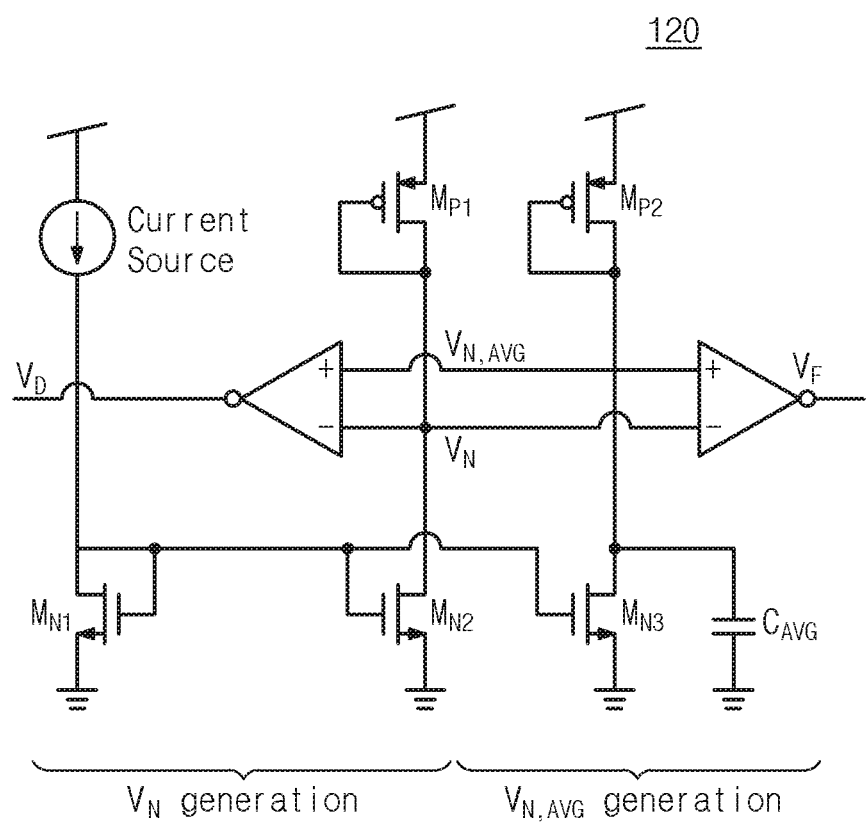
FIG. 4 shows a detector of the voltage controlled oscillator in accordance with an embodiment of the present invention.

FIG. 4 shows the controller 120 of the voltage controlled oscillator 100 in accordance with an embodiment of the present invention. The controller 120 may comprise a detector and a voltage generator.

The detector detects noise of the power voltage. In detail, the detector 120 may detect variation of the power voltage ($V_N$) and average of the variation ($V_{N,AVG}$).

Referring to FIG. 4, the detector comprises a first NMOS transistor and a first PMOS transistor connected between a ground node and a power source supplied with the power voltage. $V_N$ may be detected by a power division by impedance of the first NMOS transistor and the first PMOS transistor. Referring to FIG. 4 again, the detector 120 comprising: a second NMOS transistor; a second PMOS transistor connected between a power source and a ground node; and a capacitor connected to the second NMOS transistor in a row. $V_{N,AVG}$ may be determined by voltage of a node connected with the second PMOS transistor, the second NMOS transistor, and the capacitor.

As shown in FIG. 4, the controller 120 may comprise a voltage generator. The voltage generator generates a feed forward control voltage ($V_F$) for controlling the inverter of the feed forward path and a direct control voltage ($V_D$) for controlling the inverter of the direct path based on a difference of $V_{N,AVG}$ and $V_N$.

Referring to FIG. 4, the voltage generator may comprise: a first inverting amplifier receiving $V_{N,AVG}$ in a non-inverting electrode and receiving $V_N$ in a inverting electrode; and a second inverting amplifier receiving $V_{N,AVG}$ in the inverting electrode and receiving $V_N$ in the non-inverting electrode. The first inverting amplifier may output $V_D$ and the second inverting amplifier may output $V_F$.

When $V_N$>$V_{N,AVG}$, the $V_D$ gets larger than the $V_F$ and thereby oscillation frequency of the oscillator 110 where a body bias is controlled may be decreased. In contrast, when $V_{N,AVG}$>$V_N$, the $V_F$ gets larger than the $V_D$ and thereby oscillation frequency of the oscillator 110 where a body bias is controlled may be increased.

Figure 5A:
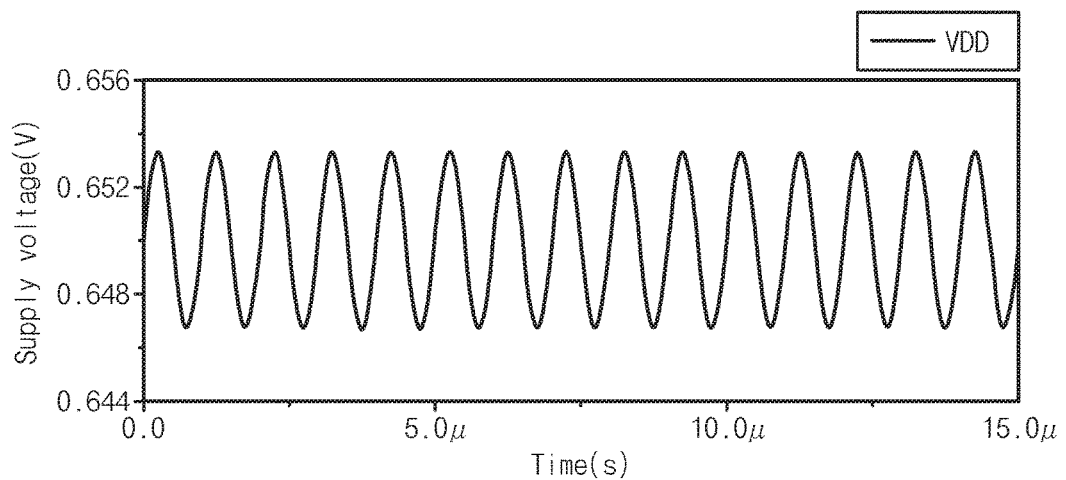
FIGS. 5a to 5c are diagrams showing power voltage, a variation of a power voltage, and body bias in changes of voltage times, respectively.
Figure 5B:
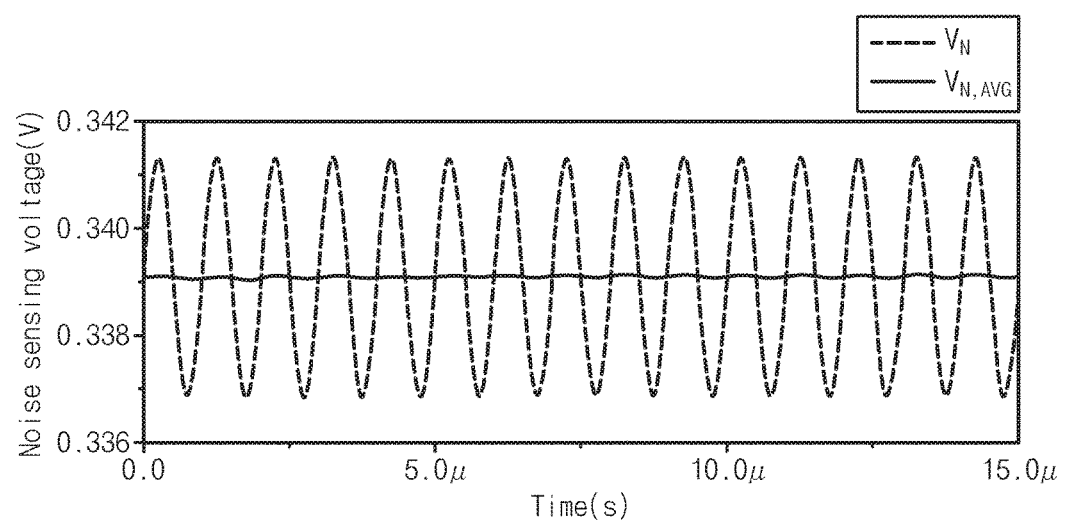
Figure 5C:
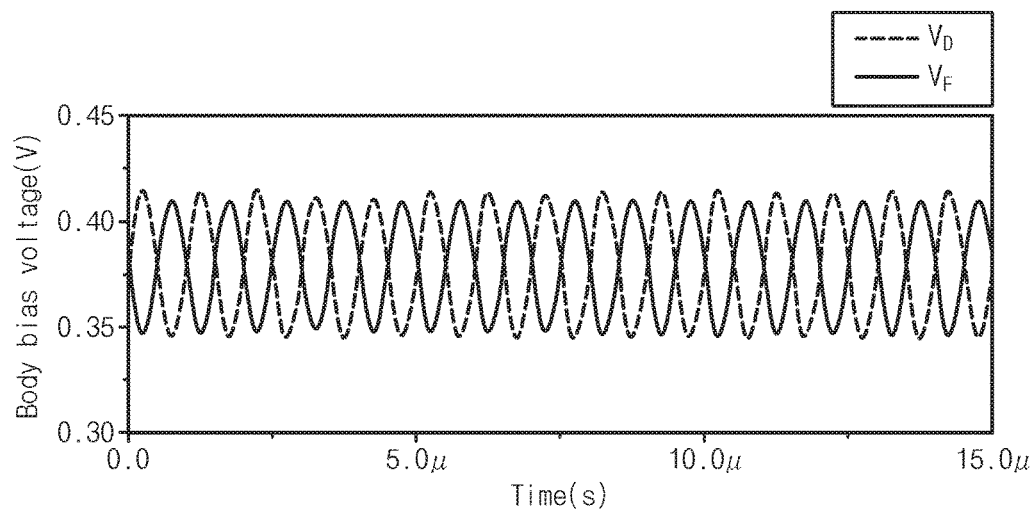

FIGS. 5a to 5c are diagrams showing power voltage, a variation of a power voltage, and body bias in changes of voltage times, respectively.

FIG. 5a shows a graph of change in power voltage (VDD) by a noise and FIG. 5b shows detected $V_N$ and $V_{N,AVG}$. FIG. 5c shows bias control voltage ($V_D$, $V_F$) generated by the detected $V_N$ and $V_{N,AVG}$.

Figure 5D:
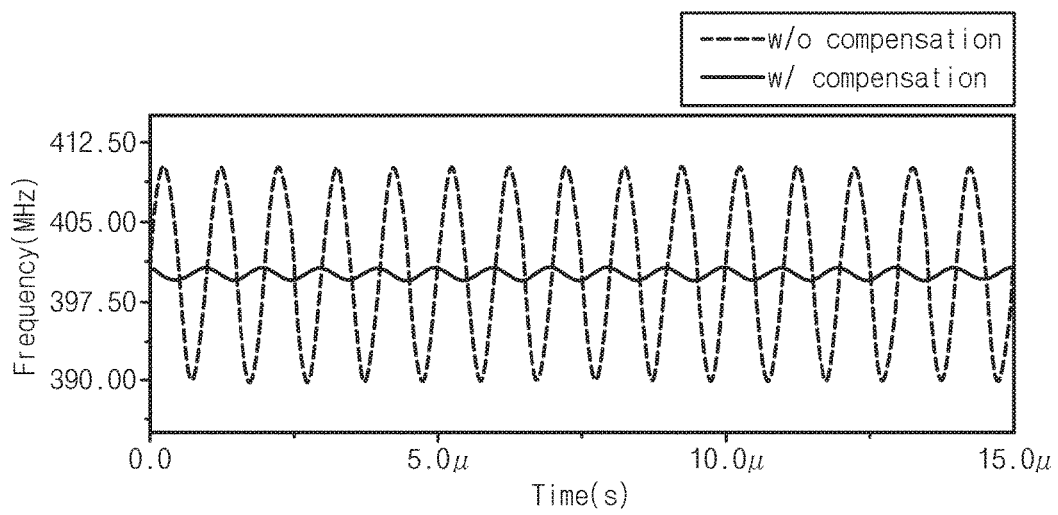
FIG. 5d is a graph showing oscillation frequency of the voltage controlled oscillator in accordance with an embodiment and comparison exemplary of the present invention.

FIG. 5d is a graph showing oscillation frequency of the voltage controlled oscillator in accordance with an embodiment and comparison exemplary of the present invention. Effect of a noise affecting oscillation frequency has been decreased when operated with compensation in accordance with an embodiment of the present invention (w/ compensation) than when operated without compensation in accordance with a comparison exemplary (w/o compensation).

Figure 6:
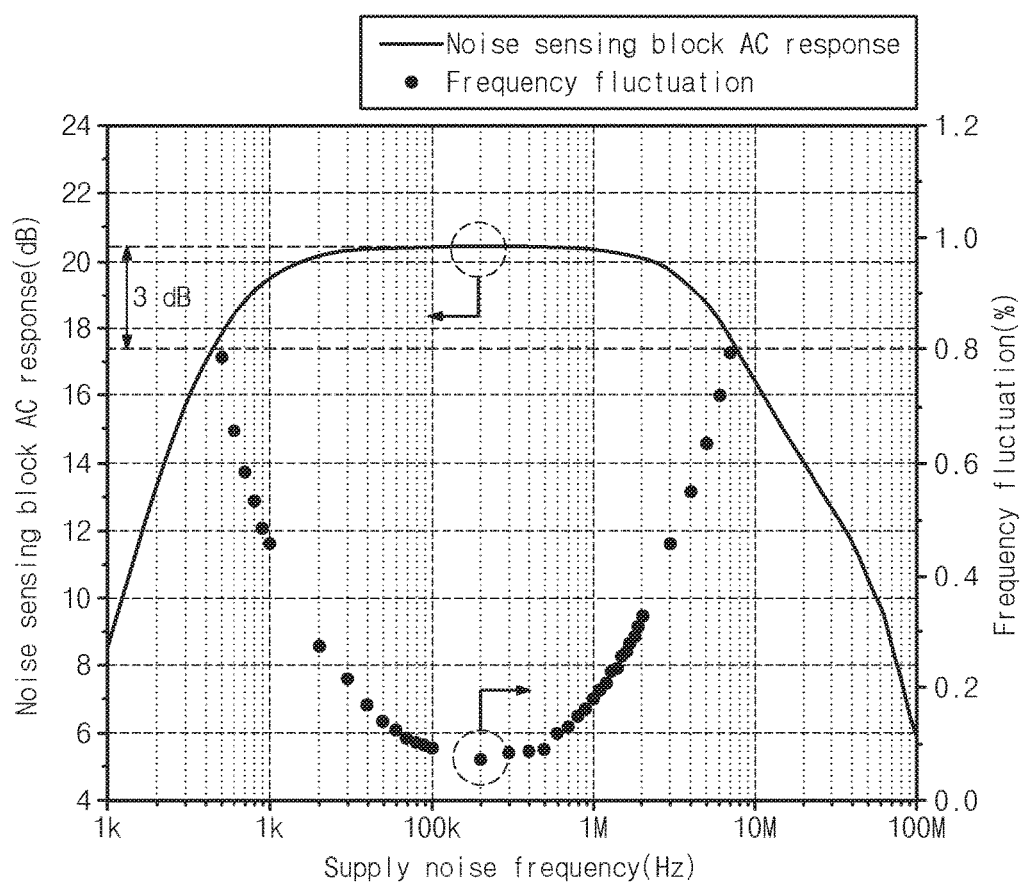
FIG. 6 is a graph showing change of compensated oscillation frequency according to a power voltage noise and a frequency response of the detector of the voltage controlled oscillator in accordance with an embodiment of the present invention.

FIG. 6 is a graph showing change of compensated oscillation frequency according to a noise of a power voltage and a frequency response of the detector of the voltage controlled oscillator in accordance with an embodiment of the present invention. Referring to FIG. 6, when a noise frequency of the power voltage is within bandwidth of the detector, the change of oscillation frequency is below 0.8%. The phase locked loop and the voltage controlled oscillator has a feature of a band-pass filter to a noise of the power voltage. As a result, if the bandwidth of the detector comprises a bandwidth of the phase locked loop, the detector may operate appropriately.

Foregoing embodiments are provided to help understanding of the inventive concept, but do not limit the scope of the inventive concept, and thus those with ordinary skill in the technical field of the inventive concept pertains will be understood that the inventive concept can be carried out in other specific forms without changing the technical idea or essential features. Therefore, the technical scope of protection of the inventive concept will be determined by the technical idea of the scope of the appended claims, and also will be understood as not being limited to the literal description in itself, but reaching the equivalent technical values of the inventive concept.

What is claimed is:
1. A voltage controlled oscillator comprising:
an oscillator comprising a plurality of inverters connected as a ring form for generating a plurality of signals having different phases with each other, and a plurality of feed forward circuits formed between the inverters; and a controller for controlling the plurality of inverters and the plurality of feed forward circuits based on a detected noise by detecting a noise of a power voltage.

2. A voltage controlled oscillator comprising:

an oscillator comprising a plurality of inverters connected as a ring form for generating a plurality of signals having different phases with each other, and a plurality of feed forward circuits formed between the inverters; and a controller for controlling the inverter and the feed forward circuit based on a detected noise by detecting a noise of a power voltage, wherein the controller comprises a detector detects a variation of the power voltage and average of the variation.

3. The voltage controlled oscillator of claim 2, wherein the detector comprises:

a first NMOS transistor and a first PMOS transistor connected between a ground node and a power source supplied with the power voltage and a first NMOS transistor, wherein the variation is detected by voltage division from impedance of the first PMOS transistor and the first NMOS transistor.

4. The voltage controlled oscillator of claim 3, wherein the detector comprises a second NMOS transistor and a second PMOS transistor connected between a ground node and a power source supplied with the power voltage, and a capacitor connected to the second NMOS transistor in a row, wherein the average is determined by voltage of a node connected with the second PMOS transistor, the second NMOS transistor, and the capacitor.

5. The voltage controlled oscillator of claim 2, wherein the controller comprises a voltage oscillator for generating a voltage for controlling the the plurality of feed forward circuits and plurality of inverters based on a difference between the variation and the average.

6. The voltage controlled oscillator of claim 5, wherein the voltage oscillator comprises:

a first inverting amplifier for outputting a direct control voltage for controlling the plurality of inverters, receiving the variation in an inverting electrode, and receiving the average in a non-inverting electrode; and a second inverting amplifier for outputting a feed forward control voltage for controlling the plurality of feed forward circuits, receiving the average in an inverting electrode and receiving the variation in a non-inverting electrode.

7. The voltage controlled oscillator of claim from 6, wherein the inverter comprises:

a CMOS inverter where a body bias of a PMOS transistor is controlled by the direct control voltage, wherein the feed forward circuit comprises a CMOS inverter where a body bias of a PMOS transistor is controlled by the feed forward control voltage.

8. A phase locked loop comprising:

a phase frequency detector for outputting a pull-up signal or a pull-down signal by detecting voltage and frequency of a feedback signal which corresponds to an input signal and an output signal;

a charge pump for outputting a control voltage corresponding to the pull-up signal or the pull-down signal;

a loop filter for removing high frequency component of the control voltage; and a voltage controlled oscillator for generating the output signal having a variable frequency depending on a control signal of the loop filter, wherein the voltage controlled oscillator comprises:

an oscillator comprising a plurality of inverters connected as a ring form for generating a plurality of signals having different phases with each other, and a plurality of feed forward circuits formed between the inverters; and a controller for controlling the plurality of inverters and the plurality of feed forward circuits based on a detected noise by detecting a noise of a power voltage.

9. A phase locked loop comprising:

a phase frequency detector for outputting a pull-up signal or a pull-down signal by detecting voltage and frequency of a feedback signal which corresponds to an input signal and an output signal;

a charge pump for outputting a control voltage corresponding to the pull-up signal or the pull-down signal;

a loop filter for removing high frequency component of the control voltage; and a voltage controlled oscillator for generating the output signal having a variable frequency depending on a control signal of the loop filter, wherein the voltage controlled oscillator comprises:

an oscillator comprising a plurality of inverters connected as a ring form for generating a plurality of signals having different phases with each other, and a plurality of feed forward circuits formed between the inverters; and a controller for controlling the plurality of inverters and the plurality of feed forward circuits based on a detected noise by detecting a noise of a power voltage, wherein the controller comprises a detector for detecting a variation of the power voltage and average of the variation.

10. The phase locked loop of claim 9, wherein the detector comprises:

a first NMOS transistor and a first PMOS transistor connected between a ground node and a power source supplied with the power voltage, wherein the variation is detected by voltage division from impedance of the first PMOS transistor and the first NMOS transistor.

11. The phase locked loop of claim 10, wherein the detector comprises:

a second NMOS transistor and a second PMOS transistor connected between a ground node and a power source supplied with the power voltage; and a capacitor connected to the second NMOS transistor in a row, wherein the average may be determined by voltage of a node connected with the second PMOS transistor, the second NMOS transistor, and the capacitor.

12. The phase locked loop of claim 9 further comprising a voltage generator for generating a voltage for controlling the plurality of feed forward circuits and plurality of inverters based on a difference between the variation and the average.

13. The phase locked loop of claim 12, wherein the voltage generator comprises:

a first inverting amplifier for outputting a direct control voltage controlling the plurality of inverters, getting the variation in an inverting electrode, and getting the average in a non-inverting electrode; and a second inverting amplifier for outputting a feed forward control voltage controlling the plurality of feed forward circuits, getting the average in an inverting electrode and getting the variation in a non-inverting electrode.

14. The phase locked loop of claim 13, wherein each inverter is a CMOS inverter where a supply current is controlled by a PMOS transistor controlled by a control signal of the loop filter and connected to a top of each inverter.

15. The phase locked loop of claim 13, wherein each inverter comprises:
 a CMOS inverter which a body bias of a PMOS transistor is controlled by the direct control voltage,
 wherein each feed forward circuit comprises a CMOS inverter which a body bias of a PMOS transistor is controlled by the feed forward control voltage.

* * * * *